(12) United States Patent
Rocktaeschel et al.

(10) Patent No.: US 9,568,845 B2
(45) Date of Patent: Feb. 14, 2017

(54) MIRROR FOR USE IN A MICROLITHOGRAPHY PROJECTION EXPOSURE APPARATUS

(75) Inventors: Martin Rocktaeschel, Abtsgmuend (DE); Hartmut Enkisch, Aalen (DE); Franz-Josef Stickel, Aalen (DE); Oliver Natt, Aalen (DE); Hans-Juergen Mann, Oberkochen (DE); Sascha Migura, Aalen-Unterrombach (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 789 days.

(21) Appl. No.: 13/417,510

(22) Filed: Mar. 12, 2012

(65) Prior Publication Data

US 2012/0229784 A1 Sep. 13, 2012

Related U.S. Application Data

(63) Continuation of application No. PCT/EP2010/062426, filed on Aug. 26, 2010.

(30) Foreign Application Priority Data

Sep. 15, 2009 (DE) .................. 10 2009 029 471

(51) Int. Cl.
*G03B 27/68* (2006.01)
*G03B 27/52* (2006.01)
(Continued)

(52) U.S. Cl.
CPC ......... *G03F 7/70958* (2013.01); *G02B 5/0833* (2013.01); *G03F 7/70191* (2013.01); *G03F 7/70308* (2013.01); *G03F 7/70316* (2013.01)

(58) Field of Classification Search
CPC .. G02B 5/0833; G03F 7/7015; G03F 7/70191; G03F 7/702; G03F 7/70316; G03F 7/70308; G03F 7/70958
(Continued)

(56) References Cited

U.S. PATENT DOCUMENTS 4,969,175 A 11/1990 Nelson et al.
6,392,792 B1 * 5/2002 Naulleau .............. B82Y 10/00
216/2

(Continued)

FOREIGN PATENT DOCUMENTS

CN 101278376 A 10/2008
EP 1306698 A1 5/2003
(Continued)

OTHER PUBLICATIONS

Boher et al. "Silicon/silicon oxide and silicon/silicon nitride multilayers for extreme ultraviolet optical applications." Optical Engineering Aug. 1991.*
(Continued)

*Primary Examiner* — Christina Riddle
(74) *Attorney, Agent, or Firm* — Edell, Shapiro & Finnan, LLC

(57) ABSTRACT

A mirror including a substrate and a reflective coating that includes a first group of layers and a second group of layers arranged between the substrate and the first group of layers. Both the first and second groups of layers include a plurality of alternating first material layers and second material layers, arranged one above another. The refractive index of the first material for radiation in the range of 5-30 nm is greater than the refractive index of the second material in that wavelength range. The first group of layers is configured to have a number of layers that is greater than 20, such that, upon irradiation with radiation having a wavelength in the
(Continued)

range of 5-30 nm, less than 20% of the radiation reaches the second group of layers, which has a layer thickness variation for correcting the surface form of the mirror.

6 Claims, 7 Drawing Sheets

(51) Int. Cl.
  *G03B 27/54* (2006.01)
  *G03F 7/20* (2006.01)
  *G02B 5/08* (2006.01)
(58) Field of Classification Search
  USPC .... 355/52, 53, 55, 67–71, 77; 359/359, 584, 359/586, 846; 250/492.1, 492.2, 492.22, 493.1, 250/548
  See application file for complete search history.

(56) References Cited

U.S. PATENT DOCUMENTS

| | | | |
|---|---|---|---|
| 6,833,223 B2 * | 12/2004 | Shiraishi | 430/5 |
| 6,833,904 B1 * | 12/2004 | Komatsuda | G03F 7/70108 355/53 |
| 2003/0081722 A1 * | 5/2003 | Kandaka et al. | 378/70 |
| 2003/0147139 A1 | 8/2003 | Kandaka et al. | |
| 2004/0061868 A1 * | 4/2004 | Chapman et al. | 356/503 |
| 2004/0256047 A1 * | 12/2004 | Sekine | 156/94 |
| 2005/0117233 A1 | 6/2005 | Kanazawa et al. | |
| 2005/0271957 A1 * | 12/2005 | Miyachi et al. | 430/30 |
| 2006/0007433 A1 * | 1/2006 | Ikuta et al. | 356/237.2 |
| 2007/0081229 A1 * | 4/2007 | Shiraishi | 359/359 |
| 2007/0091420 A1 * | 4/2007 | Hosoya et al. | 359/359 |
| 2007/0091421 A1 | 4/2007 | Hosoya et al. | |
| 2008/0204861 A1 | 8/2008 | Shiraishi | |
| 2011/0228245 A1 * | 9/2011 | Mann | 355/67 |

FOREIGN PATENT DOCUMENTS

| | | |
|---|---|---|
| EP | 1947682 A1 | 7/2008 |
| JP | 2002311198 A | 10/2002 |
| JP | 2007109964 A | 4/2007 |
| KR | 20070041383 A | 4/2007 |
| KR | 20080056763 A | 6/2008 |
| WO | 2007043414 A1 | 4/2007 |

OTHER PUBLICATIONS

Office Action in corresponding Korean Application No. 1020127006642, mailed Jan. 27, 2014, along with an English translation.
Office Action in corresponding Chinese Application No. 201080041007.8, mailed Apr. 18, 2014, along with an English translation.
International Search Report and Written Opinion in counterpart International Application No. PCT/EP2010/062426, mailed Dec. 27, 2010.
Office Action in corresponding Japanese Application No. 2012-529194, mailed Jul. 2, 2013, along with an English translation.
Office Action in corresponding Chinese Application No. 201080041007.8, mailed Aug. 5, 2013, along with an English translation.
Office Action in corresponding Korean Application No. 1020127006642, mailed May 28, 2013, along with an English translation.
Office Action in corresponding Chinese Application No. 201080041007.8, mailed Jan. 6, 2015, along with an English translation.
Office Action in corresponding Japanese Application No. 2012-529194, dated Oct. 13, 2015, along with an English translation.
Office Action in corresponding Chinese Application No. 201080041007.8, mailed Sep. 25, 2015, along with an English translation.

* cited by examiner

543

541

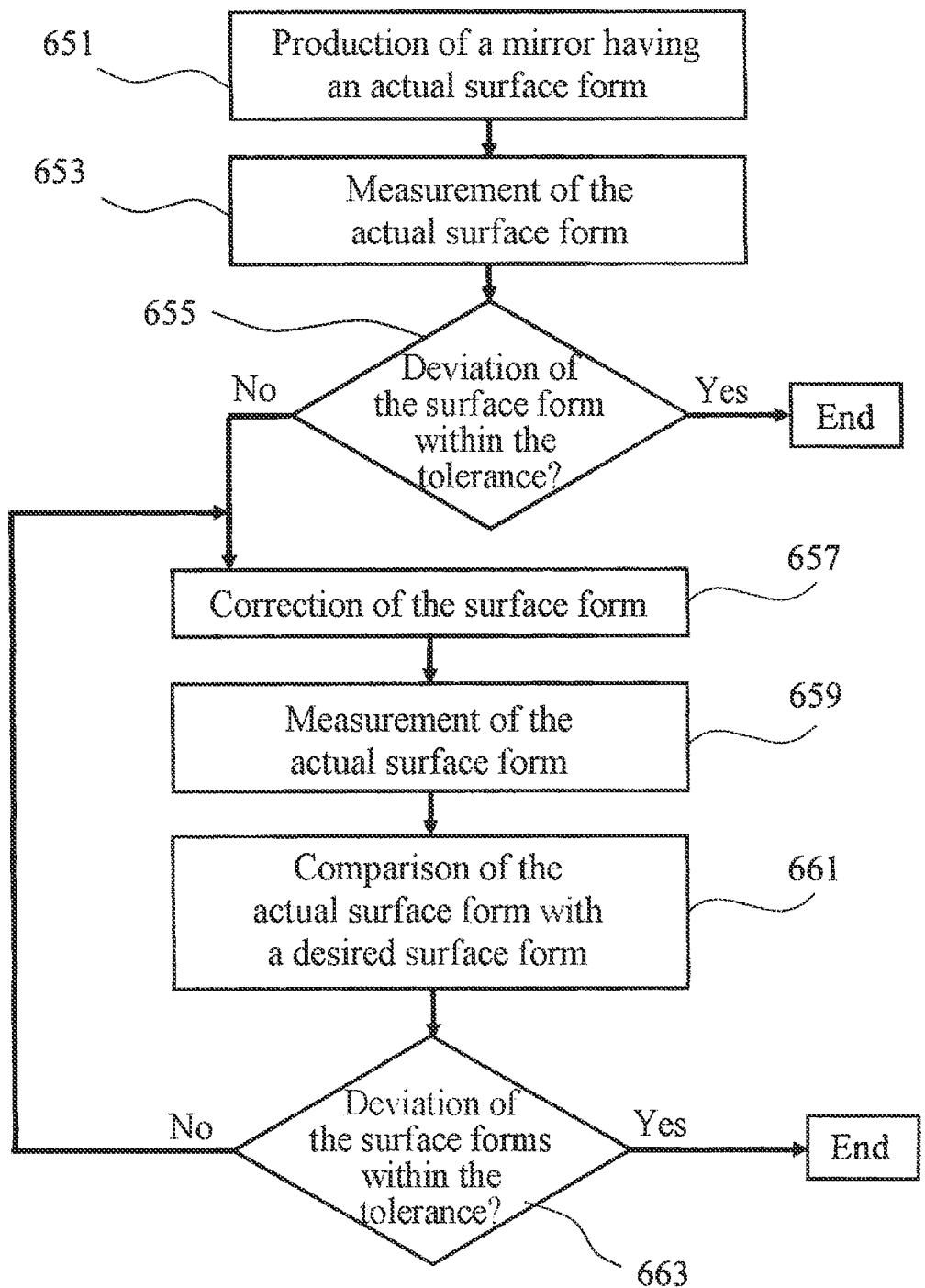

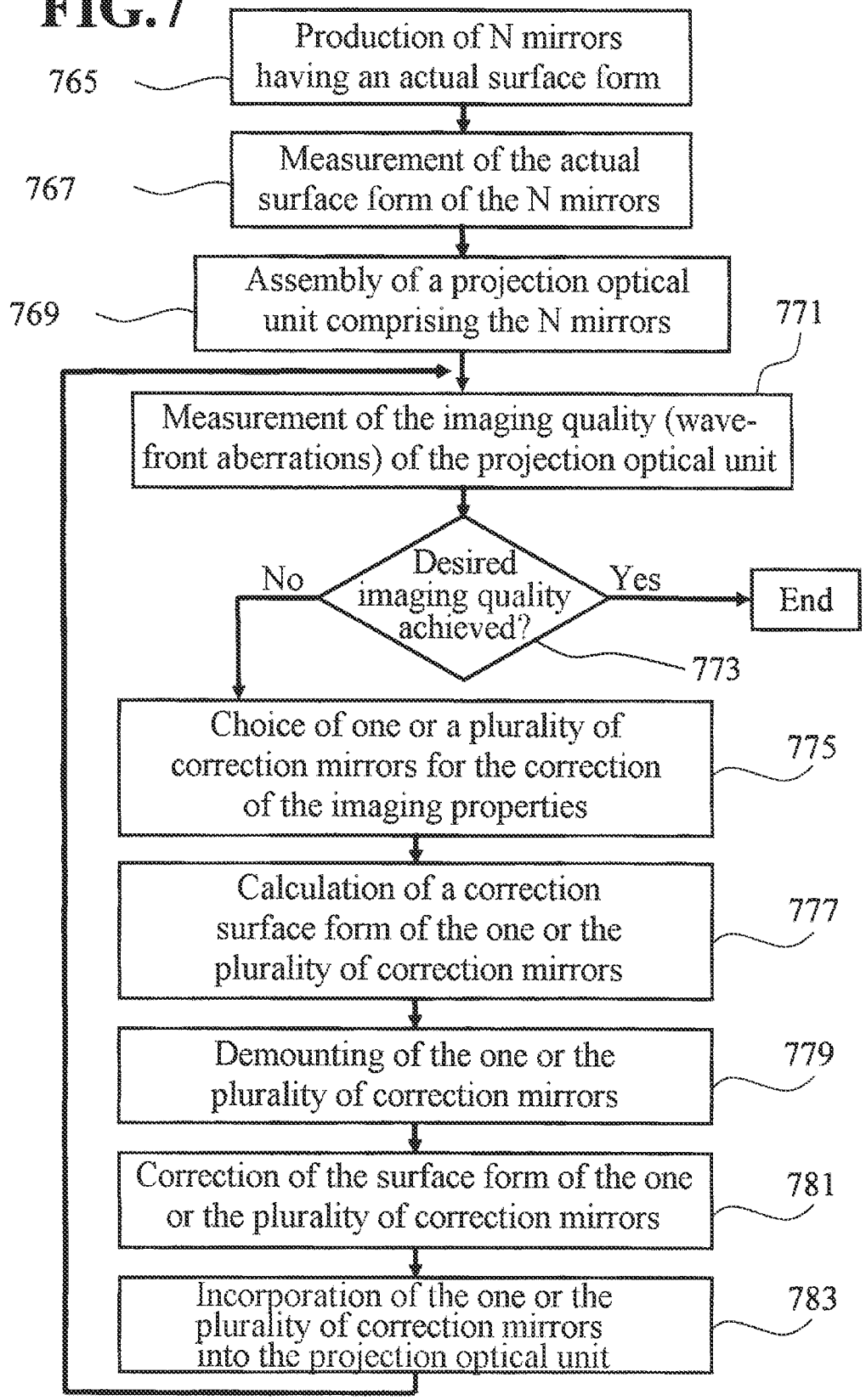

MIRROR FOR USE IN A MICROLITHOGRAPHY PROJECTION EXPOSURE APPARATUS

CROSS REFERENCE TO RELATED APPLICATIONS

This is a Continuation of International Application No. PCT/EP2010/062426, with an international filing date of Aug. 26, 2010, which was published under PCT Article 21(2) in English, and which claims priority to German Patent Application No. 10 2009 029 471.6, which was filed on Sep. 15, 2009. The entire contents of both the international and the German applications are hereby incorporated into the present application by reference.

FIELD OF AND BACKGROUND OF THE INVENTION

The present invention relates to a mirror for use in a microlithography projection exposure apparatus comprising a substrate and a reflective coating, a projection objective for use in a microlithography projection exposure apparatus, a microlithography projection exposure apparatus, and also a method for the correction of a surface form of a mirror comprising a substrate and a reflective coating.

Microlithography projection exposure apparatuses serve for producing microstructured components by means of a photolithographic method. In this case, a structure-bearing mask, the so-called reticle, is imaged onto a photosensitive layer with the aid of a projection optical unit. The minimum feature size that can be imaged with the aid of such a projection optical unit is determined by the wavelength of the imaging light used. The smaller the wavelength of the imaging light used, the smaller the structures that can be imaged with the aid of the projection optical unit. Nowadays, imaging light having the wavelength of 193 nm or imaging light having a wavelength in the extreme ultraviolet (EUV) range, i.e. 5 nm-30 nm is principally used. When imaging light having a wavelength of 193 nm is used, both refractive optical elements and reflective optical elements are employed within the microlithography projection exposure apparatus. By contrast, when imaging light having a wavelength in the range of 5 nm-30 nm is used, exclusively reflective optical elements (mirrors) are used.

In order to enable a good imaging of the structure-bearing mask onto the photosensitive layer, it is necessary for the imaging aberrations of the projection optical unit to be reduced as far as possible. Therefore, it is necessary to ensure the surface form of, in particular, the mirrors used within the projection optical unit with a high precision.

For this purpose, it is necessary to measure the optical properties of the individual mirror or of the projection optical unit highly precisely. This is done, for example, by means of an interferometric measurement method such as are described in EP 1306698 A1. Such measurements are often carried out under conditions which correspond as well as possible to the use conditions of the mirror. This concerns, in particular, the wavelength of the light used for measurement. The exact influence of a mirror on imaging light having a specific wavelength can be measured very exactly using light having this wavelength, in particular. In the case of measurement using light having a different wavelength, uncertainties can occur which result from the difference between the measurement wavelength and the imaging wavelength. A mirror for use with imaging light having a wavelength in the range of 5-30 nm is therefore often also measured using corresponding radiation. In order that the mirror reflects the measurement radiation, however, it is necessary to provide the mirror with a suitable reflective coating. This has the further advantage that the influences of the reflective coating on the surface form, such as introduction of stress, for example, are likewise taken into account during the measurement.

However, the measurement of the mirror with a reflective coating has the disadvantage that a correction of the surface form of the mirror becomes more difficult. Such a correction is carried out for example by suitable surface removal using ion beams. However, this can lead to an impairment of the reflectivity since the reflective coating has been altered by the removal.

OBJECTS AND SUMMARY OF THE INVENTION

An object of the present invention is to provide a mirror and a method for producing such a mirror which can be measured using radiation having a wavelength corresponding to the wavelength of the imaging light to be used, the surface form of which mirror can thereupon be corrected and which mirror nevertheless has a high reflectivity.

This object is achieved by means of a mirror for use in a microlithography projection exposure apparatus, comprising a substrate and a reflective coating, wherein the reflective coating itself in turn comprises a first group of layers and a second group of layers. In this case, the second group of layers is arranged between the substrate and the first group of layers. Furthermore, both the first group of layers and the second group of layers comprise a plurality of alternating first and second layers arranged one above another, wherein the first layers comprise a first material, the refractive index of which for radiation having a wavelength in the range of 5-30 nm is greater than the refractive index of a second material, which the second layers comprise. In this case, the first group of layers is configured in such a way that it comprises a number of layers that is greater than 20, such that, upon irradiation with radiation having a wavelength in the range of 5-30 nm, less than 20% of the radiation reaches the second group of layers, and wherein the second group of layers has a layer thickness variation for the correction of the surface form of the mirror. What is thereby achieved is that the second group of layers, which has a layer thickness variation for the correction of the surface form of the mirror, does not significantly affect the reflectivity properties of the mirror. Otherwise, radiation reflected at the second group of layers would have, at least in partial regions, phase relationships such that the optimum phase relationship of the reflected radiation would be adversely influenced and a reduction of the intensity of the reflected radiation would occur.

Such a mirror arises by firstly providing a mirror substrate with a reflective coating, which serves to reflect radiation having a wavelength corresponding to the wavelength of the imaging light to be used. In a further step, the mirror configured in this way is measured either separately or in the context of an overall measurement of an optical system, wherein radiation having a wavelength corresponding to the wavelength of the imaging light to be used is employed. On the basis of the measurement results obtained, a surface correction is determined and a corresponding layer thickness variation of the reflective coating is produced in order to suitably correct the surface form of the mirror. Since this correction often has an adverse influence on the reflectivity of the mirror, in a further step a group of layers is applied to the processed reflective coating, wherein the group comprises a number of layers that is greater than 20, such that, upon irradiation with radiation having a wavelength in the range of 5-30 nm, less than 20% of the radiation penetrates through the group of layers.

In this case, the reflective coating and the group of layers both have a plurality of alternating first and second layers arranged one above another, wherein the first layers comprise a first material, the refractive index of which for radiation having a wavelength in the range of 5-30 nm is greater than the refractive index of a second material, which the second layers comprise. This gives rise to the mirror according to the invention having a corrected surface form, wherein the reflectivity of the mirror has not been significantly impaired by the correction of the surface form.

Layer thickness variations for the correction of the surface form are approximately of the order of magnitude of a wavelength of the imaging light to be used, that is to say at a wavelength of 13.5 nm the layer thickness variation of the surface form lies between 1 nm and 15 nm.

In one embodiment, the second group of layers has a layer thickness variation for taking account of the variation of the angle of incidence of the incident radiation over the mirror. A particularly good reflectivity can thereby be made available. Layer thickness variations for taking account of the variation of the angle of incidence lie in the range of +/−10% of the total thickness of the layer.

In a further embodiment, the second group of layers directly adjoins the substrate. This has the advantage that the mirror manages with a small total number of layers, such that it can be produced particularly simply and rapidly.

In one configuration, the first material is silicon and the second material is either ruthenium or molybdenum. These materials can be used particularly well for layer stacks for the reflection of radiation having wavelengths in the range of 5-30 nm since they can be processed well and enable a high reflectivity.

It is particularly advantageous if the number of layers of the second group of layers differs at at least two locations of the mirror. A particularly large correction of the wavefront aberrations can thereby be achieved.

In one particular form of the mirror according to the invention, the second group of layers has a correction layer having a layer thickness variation for the correction of the surface form of the mirror, wherein furthermore the layer thickness variation of the second group of layers arises to the extent of more than 50% as a result of the layer thickness variation of the correction layer. The use of a correction layer having a layer thickness variation for a correction of the surface form of the mirror has the advantage that a material which enables the surface profile to be set particularly well can be chosen for the correction layer. Thus, a quartz layer can be used as the correction layer, which quartz layer can be processed particularly well using ion beams in order to achieve the surface profile.

A projection objective comprising a mirror according to the invention and a microlithography projection exposure apparatus comprising such a projection objective have the advantages that have already been explained above with regard to the mirror.

The invention likewise relates to a method for the correction of a surface form of a mirror comprising a substrate and a reflective coating. In this case, the method comprises at least the following steps:

a. producing or altering a layer thickness variation of the reflective coating for the correction of the surface form of the mirror, b. applying a group of layers to the reflective coating, wherein the group comprises a number of layers that is greater than 20, such that, upon irradiation with radiation having a wavelength in the range of 5-30 nm, less than 20% of the radiation penetrates through the group of layers.

The reflective coating and the group of layers both comprise a plurality of alternating first and second layers arranged one above another, wherein the first layers comprise a first material, the refractive index of which for radiation having a wavelength in the range of 5-30 nm is greater than the refractive index of a second material, which the second layers comprise. This method makes it possible, in particular, to provide a mirror having a corrected surface form, wherein the reflectivity of the mirror has not been significantly impaired by the correction of the surface form.

The invention furthermore comprises a method for the correction of a surface form of a mirror comprising a substrate and a reflective coating, comprising at least the following steps:

a. applying a correction layer b. producing or altering a layer thickness variation of a layer system comprising the reflective coating and the correction layer for the correction of the surface form of the mirror, wherein the layer thickness variation of the layer system is produced to the extent of more than 50% by a layer thickness variation of the correction layer, c. applying a group of layers to the layer system, wherein the group of layers comprises a number of layers that is greater than 20, such that, upon irradiation with radiation having a wavelength in the range of 5-30 nm, less than 20% of the radiation reaches the layer system.

The reflective coating and the group of layers both comprise a plurality of alternating first and second layers arranged one above another, wherein the first layers comprise a first material, the refractive index of which for radiation having a wavelength in the range of 5-30 nm is greater than the refractive index of a second material, which the second layers comprise. This method makes it possible, in particular, to provide a mirror having a corrected surface form, wherein the reflectivity of the mirror has not been significantly impaired by the correction of the surface form. The application of a correction layer having a layer thickness variation for correction of the surface form of the mirror or the application of a correction layer and subsequent alteration of the layer thickness variation of the correction layer has the advantage that a material which enables the surface profile to be set particularly well can be chosen for the correction layer. Thus, a quartz layer can be used as the correction layer, which quartz layer can be processed particularly well using ion beams in order to achieve the surface profile.

The method according to the invention has the particular advantage that it can be effected even without removal of an entire layer, and it thus enables particularly efficient and rapid production of a surface correction.

The invention furthermore relates to a method for the correction of the imaging properties of a projection optical unit of a microlithography projection exposure apparatus comprising an above-described method for the correction of a surface form of a mirror of the projection optical unit.

Such a method for the correction of the imaging properties thus has the advantages described above with regard to the method for the correction of a surface form.

The invention additionally relates to a method for the correction of the imaging properties of a projection optical unit of a microlithography projection exposure apparatus comprising the following steps:

a. determining the wavefront aberrations of the projection optical unit,
b. calculating a correction surface form of at least one mirror from the wavefront aberrations of the projection optical unit,
c. correcting a surface form of the at least one mirror according to the method described above.

Such a method for the correction of the imaging properties has the advantages that have already been described above with regard to the method for the correction of a surface form.

The invention will be explained in greater detail with reference to the drawings.

BRIEF DESCRIPTION OF THE DRAWINGS

FIG. 5b shows a section through the surface to be corrected that is illustrated in FIG. 5a.

FIG. 6 shows, on the basis of a flow chart, a method for the correction of the surface form of a mirror.

FIG. 7 shows, on the basis of a flow chart, a method for the correction of the imaging quality of a projection optical unit by means of the correction of the surface form of a mirror.

DETAILED DESCRIPTION OF THE PREFERRED EMBODIMENTS

Figure 1:
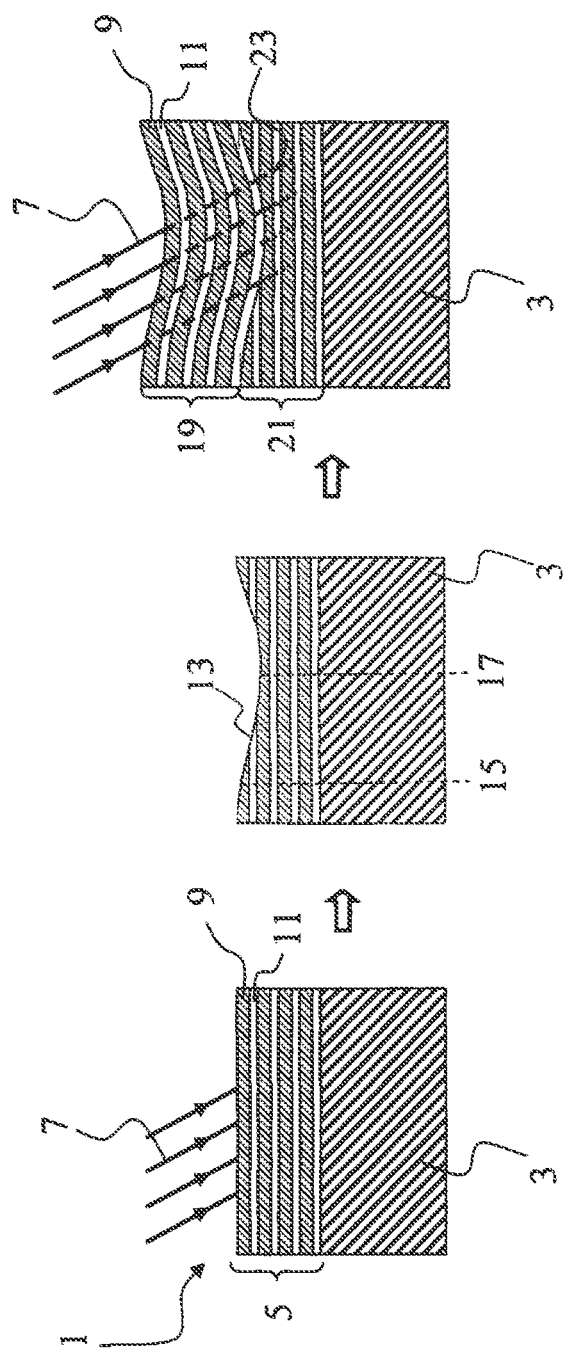
FIG. 1 shows the method for producing a mirror according to the invention in a first embodiment.

The reference signs have been chosen such that objects illustrated in FIG. 1 have been provided with single-digit or two-digit numerals. The objects illustrated in the further figures have reference signs having three and more digits, wherein the last two digits indicate the object and the preceding digits indicate the number of the figure in which the object is illustrated. The reference numerals of identical objects illustrated in a plurality of figures therefore correspond in terms of the last two digits. By way of example, the reference signs 3, 203 and 303 identify the mirror substrate in FIGS. 1, 2 and 3.

FIG. 1 shows, on the left-hand side, an embodiment of a mirror for use in a microlithography projection exposure apparatus in an initial state before correction of the surface form. The mirror 1 comprises a substrate 3 and a group of layers 5. In the present case, the substrate 3 consists of $SiO_2$ (quartz). The group of layers 5 comprises a plurality of individual layers comprising different materials. If the mirror 1 is embodied for the reflection of radiation 7 having a wavelength in the range of 5 nm-30 nm, then the group of layers 5 comprises a plurality of alternating first layers 9 and second layers 11 arranged one above another, wherein the first layers 9 comprise a first material, the refractive index of which for radiation having a wavelength in the range of 5-30 nm is greater than the refractive index of a second material contained in the second layers 11. Typically, silicon is used as first material and molybdenum or ruthenium as second material. Other material combinations such as e.g. molybdenum and beryllium, ruthenium and beryllium or lanthanum and $B_4C$ are likewise possible. In order to achieve a good reflectivity of the mirror, the group of layers 5 usually comprises more than 20 layers, in particular more than 50 layers. In FIG. 1 and also in the subsequent figures, groups of layers are always indicated just by a few individual layers, for the sake of better clarity. Within the meaning of this invention, however, groups of layers are understood to be groups having more than 20 layers, in particular having more than 50 layers. In addition to the layers already described, groups of layers 5 can also comprise intermediate layers for preventing diffusions or covering layers for preventing oxidation and corrosion. The illustration of such auxiliary layers in the figures has been omitted.

In the middle of FIG. 1, the mirror 1 is illustrated after a correction of the surface form of the mirror has been performed. Such a correction of the surface form can be achieved e.g. by irradiation with ion beams. Part of the material of the first layers 9 and of the second layers 11 in the group of layers 5 is removed by this processing, such that material is removed from the uppermost layers (i.e., the layer or layers disposed farthest from the substrate in the first group of layers) and that the surface form of the mirror 1 now follows a corrected surface profile 13. The processing has furthermore had the consequence that the groups of layers now contains a different number of layers at location 15 than at the location 17, at which a higher degree of removal has been carried out. In this state, although the mirror 1 has a corrected surface form that is better suited to the purposes of beam guiding in a microlithography projection exposure apparatus than before the correction processing, the reflectivity of the coating has also been adversely influenced by the surface processing. In order to rectify this again, a further group of layers is applied, thus resulting in a mirror 1 as in the right-hand part of FIG. 1. The mirror 1 produced in this way accordingly has a first group 19 of layers and a second group 21 of layers, wherein the second group of layers 21 is arranged between the substrate 3 and the first group 19 of layers. The first group of layers 19 likewise comprises a plurality of alternating first layers 9 and second layers 11 arranged one above another, wherein the first layers comprise a first material, the refractive index of which for radiation having a wavelength in the range of 5-30 nm is greater than the refractive index of a second material contained in the second layers 11. The first group 19 of layers comprises more than 20 layers, such that, from the incident radiation 7, a portion 23 which passes through the first group 19 of layers and thus reaches the second group 21 of layers is less than 20% of the intensity of the incident radiation. What can be achieved in this way is that the second group 21 of layers, which has a layer thickness variation for the correction of the surface form of the mirror, does not significantly affect the reflectivity properties of the mirror 1. Otherwise, radiation reflected at the second group 21 of layers would have, at least in partial regions, phase relationships such that the optimum phase relationship of the reflected radiation is adversely influenced and a reduction of the intensity of the reflected radiation occurs.

Figure 2:
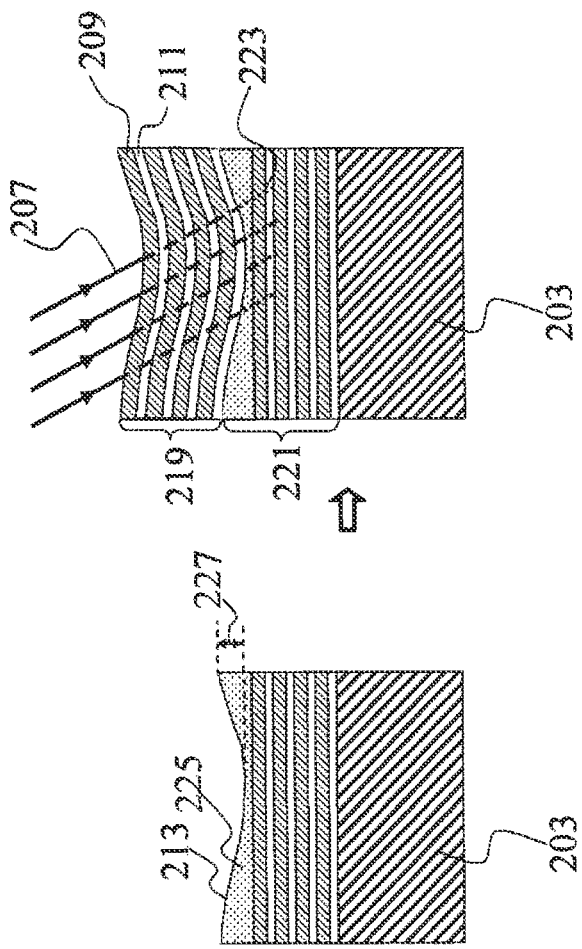
FIG. 2 shows the method for producing a mirror according to the invention in a further embodiment with a correction layer.

FIG. 2 shows a further embodiment of the method according to the invention for producing a mirror with a corrected surface form. In a manner corresponding to FIG. 1, in the left-hand region of FIG. 2 the mirror 201 is illustrated in its initial form. In this initial form, the mirror 201 comprises the mirror substrate 203 and a group 205 of layers, which is constructed from a plurality of alternating first layers 209 and second layers 211 arranged one above another. The middle region of FIG. 2 shows the mirror 201 after a suitable correction layer 225 has been added. The correction layer 225 has a layer thickness variation, thus resulting in a corrected surface profile 213. In this case, the layer thickness variation of the correction layer 225 can be brought about by a correction layer 225 of varying thickness being applied at different locations of the mirror, or alternatively or supplementarily by firstly a correction layer being applied and then the corrected surface profile 213 being set by suitable material removal such as e.g. by irradiation with ion beams. In contrast to the exemplary embodiment according to FIG. 1, the use of a correction layer 225 having a layer thickness variation for correction of the surface form of the mirror has the advantage that a material which enables the surface profile 213 to be set particularly well can be chosen for the correction layer 225. Thus, by way of example, a quartz layer can be used as correction layer 225, which quartz layer can be processed particularly well using ion beams in order to achieve the surface profile 213. By contrast, in the case of the group of layers 205 that are already present in the initial state of the mirror, materials are used which are selected in order to achieve a particularly good reflectivity for radiation having wavelengths in the range of 5-30 nm. This is necessary in order to determine the corrected surface profile on the basis of interferometric measurements. For such measurements it is necessary for the mirror to have a good reflectivity. Therefore, in the uncorrected state illustrated on the left, materials for the layers which enable a good reflectivity of the mirror are already used. Said materials are not necessarily also able to be processed well, and so it may be difficult to set a surface profile 13 in the embodiment according to FIG. 1. This difficulty is overcome by the use of the correction layer 225 composed of a suitable material. The right-hand part of FIG. 2 again shows the mirror 201 in the end state after a first group 219 of layers has been applied to the second group 221 comprising the correction layer 225 and also the further layers already present beforehand. Both groups 219 and 221 comprise a plurality of alternating first layers 209 and second layers 211 arranged one above another, wherein the first layers comprise a first material, the refractive index of which for radiation having a wavelength in the range of 5-30 nm is greater than the refractive index of a second material contained in the second layers 211. The first material is usually silicon and the second material can be e.g. molybdenum or ruthenium. Other material combinations such as e.g. molybdenum and beryllium, ruthenium and beryllium or lanthanum and $B_4C$ are likewise possible. The first group of layers 219 now has a surface form which follows the corrected surface profile 213. Said corrected surface profile 213 at the top side of the first group 219 of layers results from the fact that the first group 219 of layers substantially has a constant thickness and has been applied to the correction layer 225, which already has the corrected surface profile 213. It is therefore evident that the second group 221 of layers, which comprises the correction layer 225, has a layer thickness variation substantially produced by the layer thickness variation of the correction layer. In the context of this application, layer thickness variation of a layer or a group of layers is understood to mean the difference between the maximum thickness of the layer or the group of layers and the minimum thickness of the layer or the group of layers. The layer thickness variation is identified by the reference numeral 227 in FIG. 2. In the exemplary embodiment according to FIG. 2, the layer thickness variation 227 of the second group 221 of layers is caused exclusively by the layer thickness variation of the correction layer 225. However, it is also possible for the exemplary embodiments according to FIGS. 1 and 2 to be combined with one another, such that one part of the layer thickness variation for setting the corrected surface profile 213 arises as a result of a layer thickness variation of the correction layer 225 and another part arises as a result of a layer thickness variation of the alternating layers arranged between the correction layer and the substrate.

Figure 3:
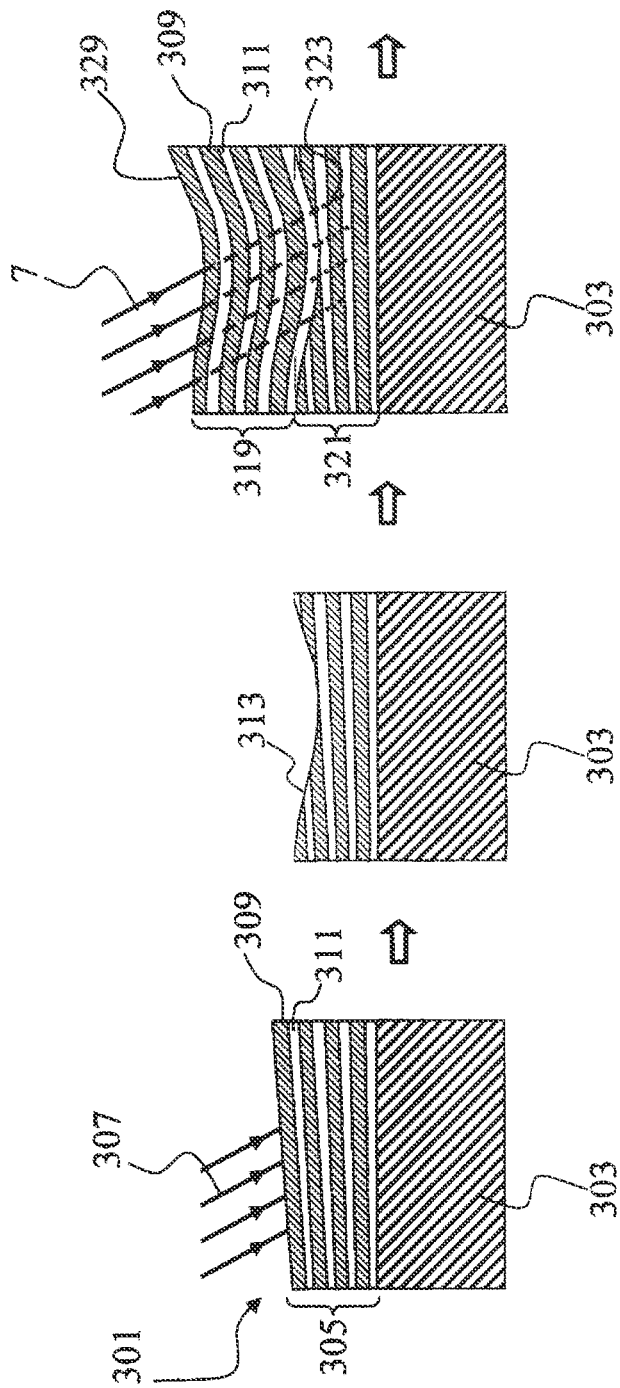
FIG. 3 shows an embodiment of the method for producing the mirror according to the invention with a layer thickness variation.

FIG. 3 illustrates a variant of the embodiment according to FIG. 1. In the initial form of the mirror, as illustrated in the left-hand region of FIG. 3, the mirror has a group of layers 305 that already exhibit a layer thickness variation over the mirror. Such a layer thickness variation is usually used if the angle of incidence of the incident radiation 307 varies to a relatively great extent over the mirror. In this way it can nevertheless be ensured that a good reflectivity can be set at every point of the mirror since, depending on the angle of incidence of the incident radiation 305, a different layer thickness of the first layers 309 and of the second layers 311 is optimal. In a manner corresponding to the procedure that has already been explained with reference to FIG. 1, a corrected surface profile 313 is produced with the aid of a suitable processing method in the case of this mirror, too. A further group of layers is then applied to the mirror processed in this way, thus resulting in the mirror 301 as illustrated in the right-hand region of FIG. 3. The mirror once again comprises a first group of layers 319 and a second group of layers 321. Just like the group 305 of layers that exhibit a layer thickness variation over the mirror, the first group 319 also has a layer thickness variation over the mirror in order to compensate for the variation of the angle of incidence of the incident radiation 307 over the mirror. This has the result that a top side 329 of the layer of the first group 319 which lies furthest away from the substrate 303 has a first maximum variation of the distance from the substrate, one part of which variation arises as a result of the layer thickness variation and another part arises as a result of the corrected surface profile 313. In the context of this application, maximum variation of the distance from the substrate is understood to mean the difference between the largest distance from the substrate and the smallest distance from the substrate. The surface profile 313 and therefore also the underside 330 of a layer of the first group 319 that lies closest to the substrate have a variation of the distance from the substrate which lies in the range of the wavelength of the imaging radiation. This results from the fact that the wavefront of the radiation 307 is intended to be corrected with the aid of the corrected surface profile 313. In the case of radiation having a wavelength of approximately 13.5 nm, a maximum variation of approximately 1 nm to 15 nm is usually sufficient for this purpose. The layer thickness variation of the first group 319 for taking account of a variation in the angle of incidence of the incident radiation 307 over the mirror is usually less than 10% of the total thickness of all the layers of the first group 319.

Figure 4:
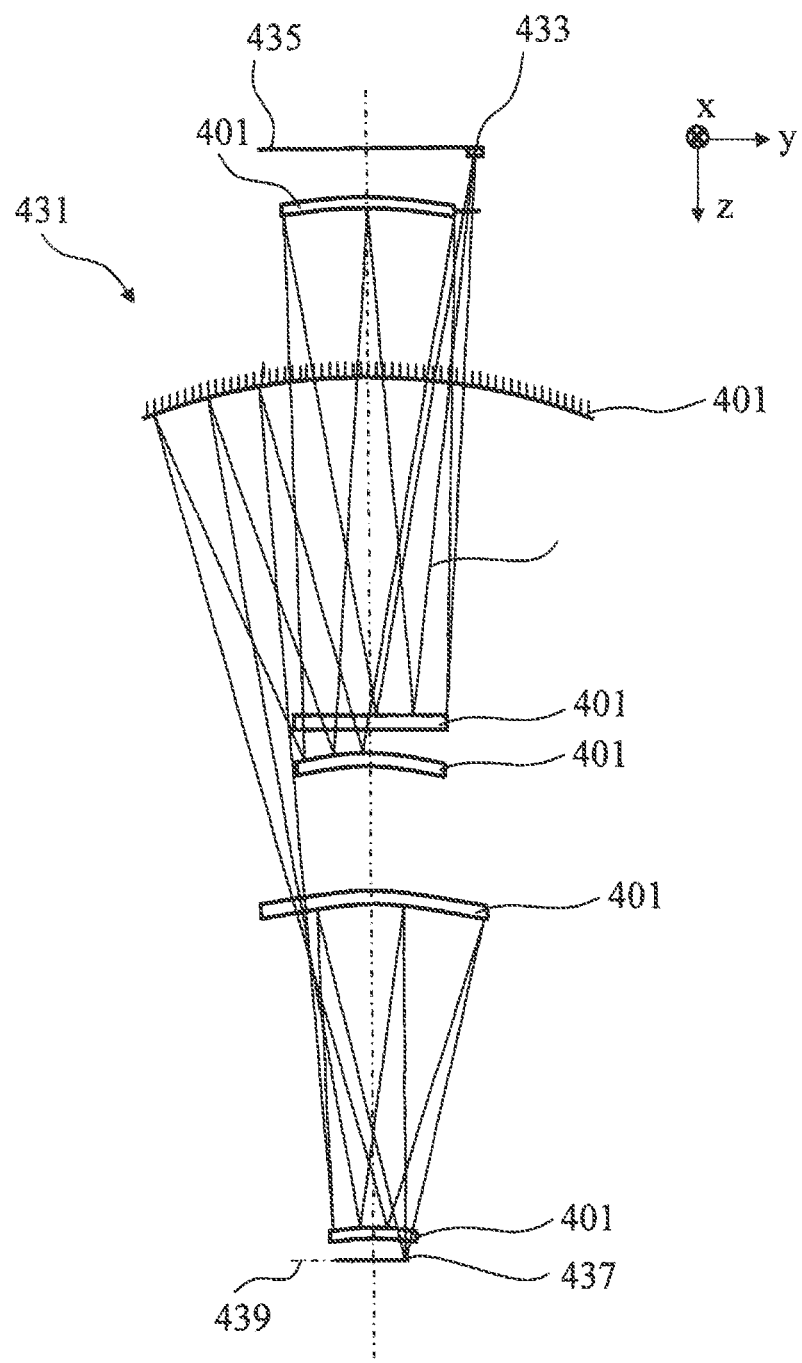
FIG. 4 shows an exemplary projection optical unit in which a mirror according to the invention can be employed.

FIG. 4 illustrates an exemplary embodiment of a projection optical unit 431. With the aid of the projection optical unit 431, a structure-bearing mask 433 arranged in an object plane 435 is imaged onto an image 437 in an image plane 439. A photosensitive layer that changes chemically as a result of the exposure is arranged in the image plane 439. This is referred to as a so-called lithographic step. In the present exemplary embodiment, the projection optical unit 431 comprises six mirrors 401 used for imaging the structure-bearing mask 433 into the image plane 439. Such a projection objective 431 is usually diffraction-limited, such that the maximum possible resolution can be achieved only when the wavefront aberration of the projection optical unit is sufficiently small. In the case of diffraction-limited projection optical units it is necessary for the RMS value (root mean square) to be less than $\frac{1}{14}$ of the wavelength of the imaging light. In order to achieve this, the surface form of the mirrors 401 has to be set highly precisely. Furthermore, the mirrors 401 likewise have to be positioned very exactly.

In addition to projection optical units which comprise only mirrors as optical components, as in the embodiment illustrated, the invention can also be employed in the case of so-called catadioptric projection objectives. Catadioptric projection objectives contain both reflective and refractive optical elements. Projection objectives of this type are usually used if the imaging light has a wavelength in the range of 193 nm or 248 nm.

Figure 5A:
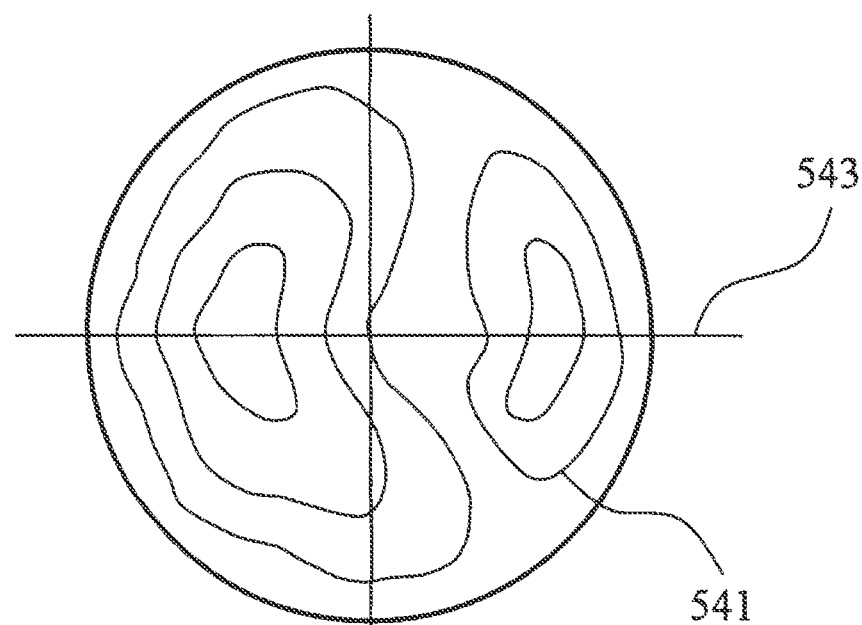
FIG. 5a schematically shows a plan view of a surface to be corrected.
Figure 5B:
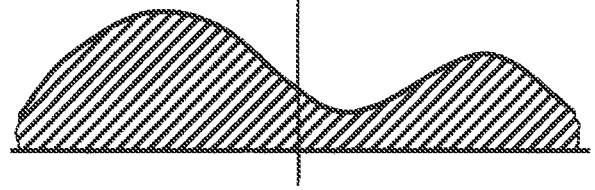

FIG. 5 shows, by way of example, the surface form to be corrected of a mirror. The deviation between the actual surface form and the desired surface form is illustrated with the aid of the contour lines 541 in FIG. 5a. Furthermore, FIG. 5b shows the height profile of this deviation along the line 543 in FIG. 5a. Such deviations shown can be determined e.g. with the aid of an interferometric measurement method.

FIG. 6 illustrates the method according to the invention for the correction of a surface form of a mirror by way of example on the basis of a flow chart. Firstly, in step 651, a mirror having an actual surface form is produced. This mirror then already comprises a substrate and a reflective coating comprising a group of layers. Afterward, in step 653, the actual surface form of the mirror is accurately measured. An interferometric measurement method such as is described e.g. in EP 1306698 A1 is usually used for this purpose. In step 655, the measured actual surface form is then compared with the desired surface form sought. If the two surface forms correspond within the desired tolerance, then the method is already concluded. If a deviation of the surface form which lies outside the tolerance is present, then a correction of the surface form is performed next in step 657. This method step 657 comprises the steps elucidated in FIGS. 1-3, that is to say, if appropriate, applying a correction layer, setting a corrected surface profile and applying a further group of layers. After this correction of the surface form, the actual surface form is measured again in step 659. In step 661, this actual surface form is then compared again with the desired surface form. In method step 663, a check is then made to determine whether the actual surface form now corresponds to the desired surface form within the tolerance. If the result is positive, then the method is concluded at this point. If a deviation outside the tolerance still results, then the method is continued again with the correction of the surface form in step 657. Depending on the magnitude of the deviation to be corrected between actual surface form and desired surface form, repeated application of this described correction loop of steps 657, 659, 661 and 663 may be necessary. In contrast to other methods for the correction of a surface form of a mirror such as are known from the prior art, the method according to the invention does not necessarily have a method step in which an entire layer is removed. The method can therefore be carried out particularly rapidly and cost-effectively. However, it is also conceivable to supplement the method by such a step, if e.g. damage to the reflective coating has occurred.

FIG. 7 illustrates the method according to the invention for the correction of the imaging properties of a projection optical unit of a microlithography projection exposure apparatus on the basis of a flow chart. In a first step 765, a plurality N of mirrors which are required for the projection optical unit are produced. On account of the production accuracy, these N mirrors have an actual surface form that can deviate from the desired surface form sought. In an optional step 767, the present actual surface form of the N mirrors is measured with the aid of an interferometric measurement method. It becomes clear from the further method that an exact knowledge of the actual surface form of all N mirrors is not absolutely necessary for carrying out the method if the deviation of the actual surface form from the desired surface form sought is not all that large. Therefore, step 767 can be dispensed with, if appropriate. In the next step 769, a projection optical unit is assembled from the N mirrors. The imaging properties of the projection optical unit are then measured in step 771. The wavefront aberrations of the entire projection objective are measured in this step 771. This is likewise done with the aid of interferometric measurement methods, such as, for example, by means of the methods described in EP 1306698 A1. In method step 773, a check is then made to determine whether the wavefront aberrations of the projection optical unit are sufficiently small. For a good imaging quality of the projection optical unit it is necessary for the RMS value of the wavefront aberrations to be less than $\frac{1}{14}$ of the wavelength of the imaging light used. If the wavefront aberrations are already sufficiently small, then the method is concluded at this point. Otherwise, it is necessary to perform a correction on the projection optical unit. In addition to altering the position of individual mirrors within the projection optical unit, it is possible to perform a correction of the wavefront aberrations by means of the correction of the surface form of one or more mirrors of the projection optical unit. In this case, it is not absolutely necessary for a correction of the surface form of all mirrors of the projection optical unit to be carried out. Depending on the specific optical design of the projection optical unit it may suffice if a correction of the surface form is carried out on a few, in particular only on one, of the mirrors. From the optical design of the projection optical unit it is possible to determine, for example, how the wavefront aberrations of the projection optical unit change if the surface form of a specific mirror is altered. It may emerge, for example, that, in the case of a first mirror, only a small change in the surface form is necessary for the correction of the wavefront aberrations, whereas a much greater change in the surface form is necessary in the case of a different, second mirror. Furthermore, specific profiles of the wavefront aberrations of the projection optical unit can be corrected only with the aid of the alteration of the surface form of mirrors which have a specific position within the imaging beam path of the projection optical unit. For this reason, the next step 775 involves making a suitable choice of correction mirrors which are particularly suitable for bringing about a correction of the wavefront aberration by means of an alteration of the surface form. In step 777 a correction surface form is then calculated for this choice of correction mirrors with the aid of the measured wavefront aberrations and the optical design of the projection optical unit. If the actual surface form of all N mirrors has been measured in a step 767 and the exact position of all N mirrors is known, the surface form of the correction mirrors can be calculated absolutely. If a measurement of the actual surface form in step 767 has been dispensed with, then only a required relative change in the surface form of the correction mirrors can be determined from the wavefront aberrations and the optical design. Both cases are combined below under the term correction surface form. A correction surface form can therefore be understood to mean an absolute surface form of the correction mirror or else the required relative change in the surface form of the correction mirror. It is often simpler to calculate only the required change in the surface form since the absolute actual surface form and position of all the mirrors are not necessarily known exactly enough. Therefore, only the necessary difference with respect to the possibly unknown actual surface form is calculated. Step 779 consists in the demounting of the one or the plurality of correction mirrors chosen in the previous steps. Next, in step 781, a correction of the surface form of the one or the plurality of correction mirrors is carried out with the aid of the calculated correction surface form. In this case, the correction of the surface form of the one or the plurality of correction mirrors is effected with the aid of a correction method such as has been described with reference to FIGS. 1-3. In the next step 783, the correction mirrors thus treated are incorporated into the projection optical unit again. The imaging quality of the projection optical unit can then be determined again in method step 771. Afterward, in method step 773, a check is made to determine whether the measured wavefront aberrations are sufficiently small, such that a sufficient imaging quality is ensured. If this is the case, then the method according to the invention is concluded at this point. Otherwise, a further correction loop comprising steps 775, 777, 779, 781 and 783 is carried out. On account of the stringent requirements in respect of the wavefront aberrations of the projection optical unit, it may be necessary that the correction loop described has to be carried out repeatedly until a sufficient imaging quality is achieved.

The above description has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

The invention claimed is:

1. A mirror configured for a microlithography projection exposure apparatus comprising:
 a substrate and a reflective coating,
 wherein the reflective coating comprises a first group of layers and a second group of layers, wherein the second group of layers is arranged between the substrate and the first group of layers,
 wherein the first group of layers and the second group of layers each comprise a plurality of alternating first and second layers arranged one above another, wherein the first layers comprise a first material and the second layers comprise a second material differing from the first material,
 wherein, for radiation having a wavelength in the range of 5-30 nm, the refractive index of the first material is greater than the refractive index of the second material,
 wherein the first group of layers comprises a number of the first and the second layers that is greater than 20,
 wherein the second group of layers has a layer thickness variation correcting a surface form of the mirror, and
 wherein the second group of layers comprises a correction layer containing a third material that differs from the first and second materials and having a layer thickness variation for correcting the surface form of the mirror, wherein the correction layer adjoins the first group of layers.

2. The mirror according to claim 1,
 wherein the layer thickness variation of the correction layer, for correcting the surface form of the mirror, is greater than a layer thickness variation of the first and second layers of the second group of layers.

3. The mirror according to claim 1,
 wherein the correction layer contains quartz as the third material.

4. The mirror according to claim 1, wherein, upon irradiation of the mirror with radiation having a wavelength in the range of 5-30 nm, less than 20% of the radiation reaches the second group of layers.

5. A method for providing a corrected surface form of a mirror comprising a substrate and a reflective coating, comprising:
 applying an initial group of layers to the substrate, wherein the initial group of layers comprises a plurality greater than 20 of alternating first and second layers, and wherein the first layers comprise a first material and the second layers comprise a second material differing from the first material,
 producing an at least partially corrected profile for the initial group of layers by removing a portion of the initial group of layers, thereby producing a layer thickness variation in the initial group of layers, and
 applying a further group of layers over the initial group of layers, wherein the further group comprises a plurality greater than 20 of alternating third and fourth layers that each extend continuously across the substrate, wherein the third layers comprise a third material and the fourth layers comprise a fourth material differing from the third material, and wherein the initial group of layers further comprises a correction layer which comprises a fifth material differing from the first material and from the second material and which is provided between the first and second layers on one side and the further group of layers on the other side.

6. The method according to claim 5, wherein the portion removed from the initial group of layers is removed predominantly from the correction layer.

* * * * *